US006472871B2

(12) United States Patent
Ryner

(10) Patent No.: US 6,472,871 B2
(45) Date of Patent: Oct. 29, 2002

(54) MAGNETIC RESONANCE SPECTROSCOPIC IMAGING WITH A VARIABLE REPETITION TIME IN CONJUNCTION WITH A VARIABLE DATA ACQUISITION TIME

(75) Inventor: Lawrence Ryner, Winnipeg (CA)

(73) Assignee: National Research Council of Canada, Ottawa (CA)

( * ) Notice: Subject to any disclaimer, the term of this patent is extended or adjusted under 35 U.S.C. 154(b) by 25 days.

(21) Appl. No.: 09/814,731

(22) Filed: Mar. 23, 2001

(65) Prior Publication Data

US 2001/0038283 A1 Nov. 8, 2001

Related U.S. Application Data

(60) Provisional application No. 60/191,763, filed on Mar. 24, 2000.

(51) Int. Cl.[7] .................................................. G01V 3/00
(52) U.S. Cl. ....................................... 324/307; 324/309
(58) Field of Search ......................... 600/410; 324/300, 324/306, 303, 307, 309, 310, 311, 312, 313, 314, 315, 316, 317, 318, 319, 320, 321, 322

(56) References Cited

U.S. PATENT DOCUMENTS

| | | | | |
|---|---|---|---|---|
| 4,549,139 A | * | 10/1985 | MacFall | 324/309 |
| 4,549,140 A | * | 10/1985 | MacFall | 324/309 |
| 4,599,565 A | * | 7/1986 | Hoenninger, III et al. | 324/309 |
| 4,604,579 A | * | 8/1986 | Cannon et al. | 324/309 |
| 4,979,512 A | * | 12/1990 | Heubes | 600/410 |
| 5,202,632 A | * | 4/1993 | Kaufman et al. | 324/309 |
| 5,239,266 A | * | 8/1993 | Kaufman et al. | 324/309 |
| 6,037,772 A | * | 3/2000 | Karczmar et al. | 324/309 |

FOREIGN PATENT DOCUMENTS

EP 0264442 B1 * 11/1987

OTHER PUBLICATIONS

Paper entitled Fast Proton Spectroscopic Imagining Employing K–Space Weighting Achieved by Variable Repetition Times by Bernd Kuhn, Wolfgang, David G. Morris & Dieter Leibfritz—(9 pages) No month 1996.
Paper entitled "Theoretic Evaluation and Comparison of Fast Chemical Shift Imaging Methods" by R. Pohmann, R; M. von Kienlin, A. Haase—Journal of Magnetic Resonance 129: 145–160 (1997)—(16 pages) 1997 No month.
Paper entitled "Relative Efficiencies of Weighting Methods for Phase–Encoded Localized NMR" by A. G. Webb, T.H. Mareci, R.W. Briggs—Journal of Magnetic Resonance Series B: 274–277 (1994)—(4 pages) 1994 No month.

* cited by examiner

Primary Examiner—Edward Lefkowitz
Assistant Examiner—Tiffany A. Fetzner
(74) Attorney, Agent, or Firm—Adrian D. Battison; Michael R. Williams; Ryan W. Dupuis

(57) ABSTRACT

A method of generating a spectroscopic image using magnetic resonance includes obtaining spectroscopic data from voxels within the volume of interest of the sample by subjecting the sample to repeated magnetic resonance experiments in one, two or three dimensions. Each experiment is effected over a repetition time TR which is defined by the sum of the excitation time, the data acquisition time and any delay time prior to the next experiment. The experiments are arranged such that the repetition time is gradually reduced for experiments encoding higher spatial frequencies relative to an initial repetition time for experiments encoding lower spatial frequencies. To permit long data acquisition times at low spatial frequencies, but short repetition times at higher spatial frequencies, the initial data acquisition time is relatively long but is gradually reduced for experiments encoding higher spatial frequencies, only reducing the data acquisition time after the delay time is reduced to zero. This allows a reduction in total time of the order of 40% while generating comparable spectroscopic image quality.

11 Claims, 4 Drawing Sheets

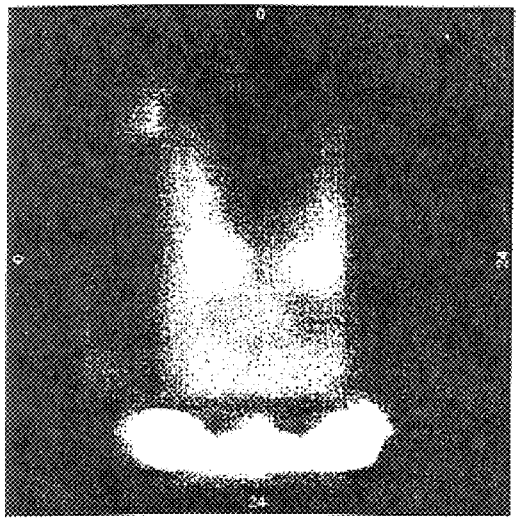
Fig. 4 Standard PRESS SI brain NAA image (19 min.)
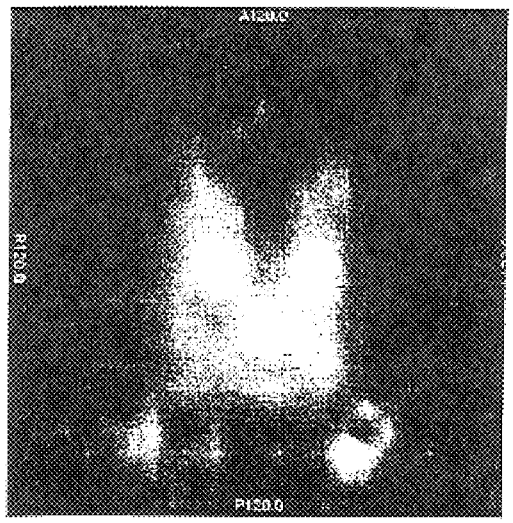
Fig. 5 Fast SI brain NAA image (11 min.)
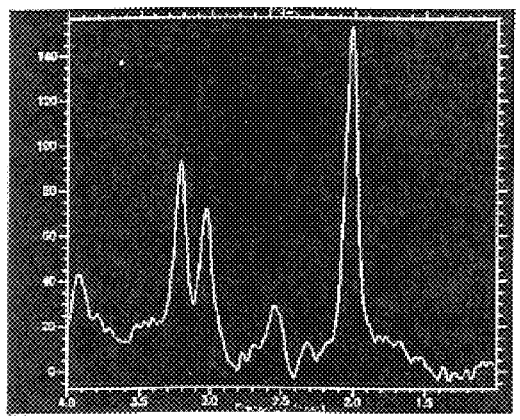
Fig. 6 Single spectrum from Fig. 1
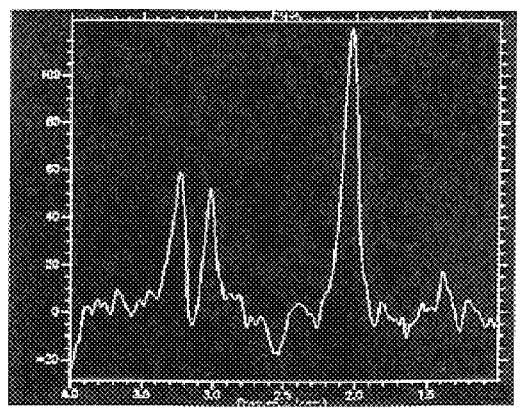
Fig. 7 Single spectrum from fast acquisition (Fig. 2) showing comparable spectral quality

MAGNETIC RESONANCE SPECTROSCOPIC IMAGING WITH A VARIABLE REPETITION TIME IN CONJUNCTION WITH A VARIABLE DATA ACQUISITION TIME

This application claims priority under 335 U.S.C.119 from Provisional Application Ser. No. 60/191,763 filed Mar. 24, 2000.

This invention relates to a method for magnetic resonance spectroscopic imaging of a sample in which a total time of imaging can be reduced while allowing the acquisition of spectra from a large number of voxels within the sample and while maintaining an acceptable image quality.

BACKGROUND OF THE INVENTION

Spectroscopic imaging (SI) is a technique that allows the acquisition of spectra from a large number of voxels in a single experiment and is thus very attractive for clinical use. The following documents provide an explanation of the general principles involved. The main impediment to routine clinical use is the long acquisition time.

A number of fast SI sequences have been developed, many of which, for example those shown in a paper by Pohmann, R., von Kienlin, M., Haase, A., in Journal of Magnetic. Resonance 129, 145–160, 1997, sacrifice spectral quality and spectral resolution for reduced acquisition times.

In a paper by Webb, A. G., Mareci, T. H., Briggs, R. W., in Journal of. Magnetic. Resonance. Ser. B., 103:274–277, 1994 is disclosed an arrangement proposing an acquisition-weighted algorithm, in which the number of averages per phase encode is varied, does not reduce spectral quality, but is only useful for applications where multiple averages per phase encode are used. Typical clinical use of proton spectroscopic imaging involves a large number of phase encodes with only one to two averages per phase encode, therefore this technique does not apply.

Another approach, disclosed in a paper by Kuhn, B., Dreher, W., Norris, D. G., Leibfritz, D., in Magn. Reson. Med., 35:457–464, 1996, to weight the data during acquisition is to vary the repetition time (TR) as a function of k-space position such that the low spatial frequency data, determining the overall contrast, are obtained with standard TRs and the higher spatial frequency data, defining the edges, are obtained with successively shorter TRs, resulting in a total acquisition time which is reduced compared to a standard acquisition technique. In this technique filtering of the k-space data is accomplished during acquisition, rather than during post-processing. The acquisition apodization function in this reduced TR technique thus depends on the T1 relaxation time of the metabolites. The primary limitation of the technique as it was proposed is the reduced spectral quality, as evidenced by poor spectral resolution, inherent to any technique that utilizes short acquisition times. The technique could be used with standard, long acquisition times but would result in minimal time-savings as compared to standard SI techniques.

A similar technique is disclosed in U.S. Pat. No. 5,202,632 of Kaufman et al issued April 1993.

SUMMARY OF THE INVENTION

It is one object of the present invention to provide a SI acquisition technique that minimizes loss of spectral quality while maintaining significant time-savings which may be as much as 40–50% as compared to standard SI.

According to the invention therefore there is provided a method of generating a spectroscopic image using magnetic resonance in a sample comprising:

locating a sample having a volume of interest in a magnetic field;

obtaining spectroscopic data from voxels within the volume of interest of the sample by subjecting the sample to repeated magnetic resonance experiments with incremented phase-encoding magnetic field gradients applied in one, two or three dimensions in which the sample is excited and phase-encoded during an excitation time, in which the sample emits signals in response to the excitation which are detected during a data acquisition time, and in which the sample magnetization relaxes towards equilibrium values during a subsequent delay time;

wherein each experiment is effected over a repetition time TR which is defined by the sum of the excitation time, the data acquisition time and any delay time prior to the next experiment;

wherein the TR is not kept constant for all experiments required to complete the acquisition of all phase-encoded signals, but is systematically reduced as a function of experiments encoding increasing spatial frequency within the volume of interest wherein the data acquisition time is reduced for experiments encoding higher spatial frequencies relative to the data acquisition time for experiments encoding lower spatial frequencies of the volume of interest, thus allowing shorter TR periods for experiments encoding higher spatial frequencies while maintaining longer TR periods with longer data acquisition times for experiments encoding lower spatial frequencies and wherein the data acquisition time for those experiments encoding low spatial frequencies is of sufficient length to obtain the desired spectral resolution, consistent with the decay of the signal due to transverse relaxation and magnetic field inhomogeneities.

The excitation time as set forth above may also include magnetization preparation such as spatial saturation and/or water suppression.

BRIEF DESCRIPTION OF THE DRAWINGS

FIG. 4 is a standard PRESS SI image for the content of NAA in brain tissue.

FIG. 5 is a PRESS SI image for the content of NAA in brain tissue using the techniques of the present invention.

FIG. 6 is a single spectrum taken using the standard method used in FIG. 4.

FIG. 7 is a single spectrum taken using the method of the present invention.

DETAILED DESCRIPTION

Figure 1:
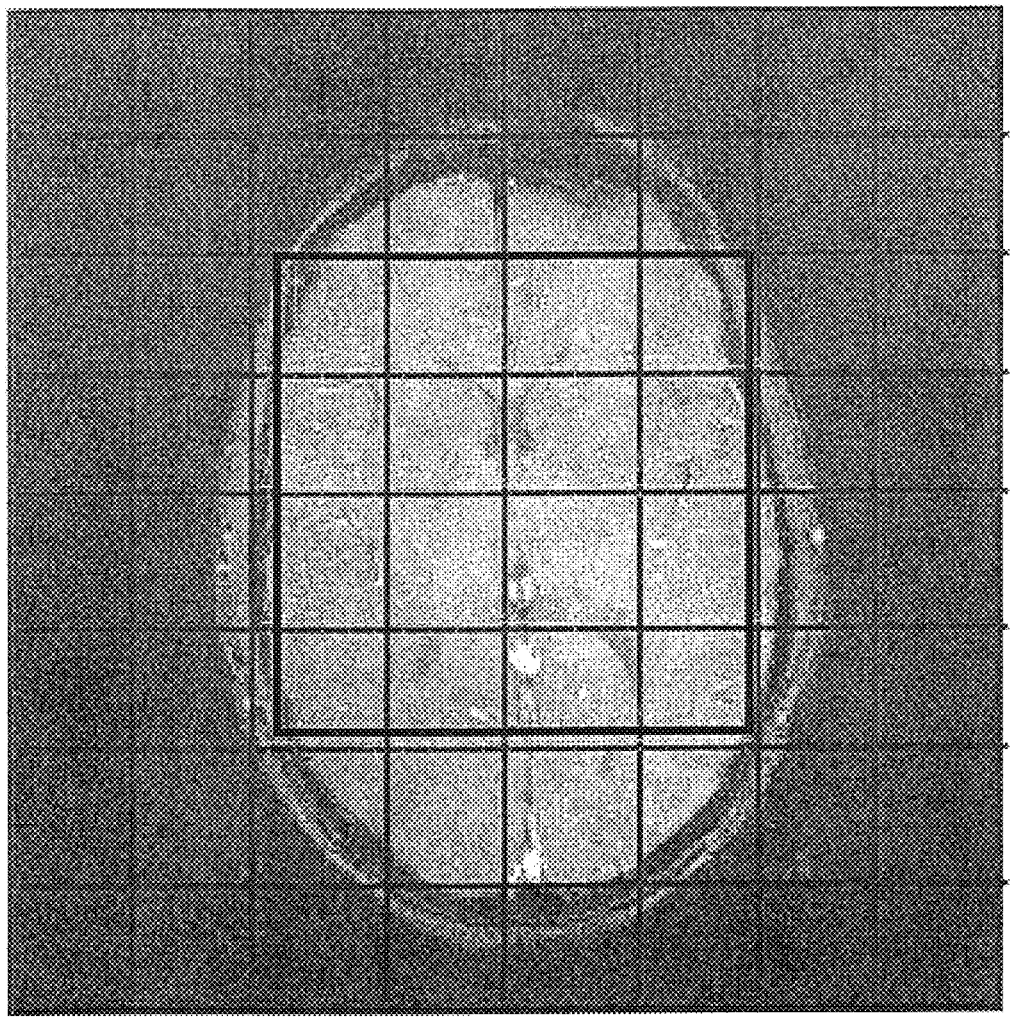
FIG. 1 is a view of a volume of interest divided into respective voxels for imaging of the spectra of each voxel using magnetic resonance imaging.
Figure 2:
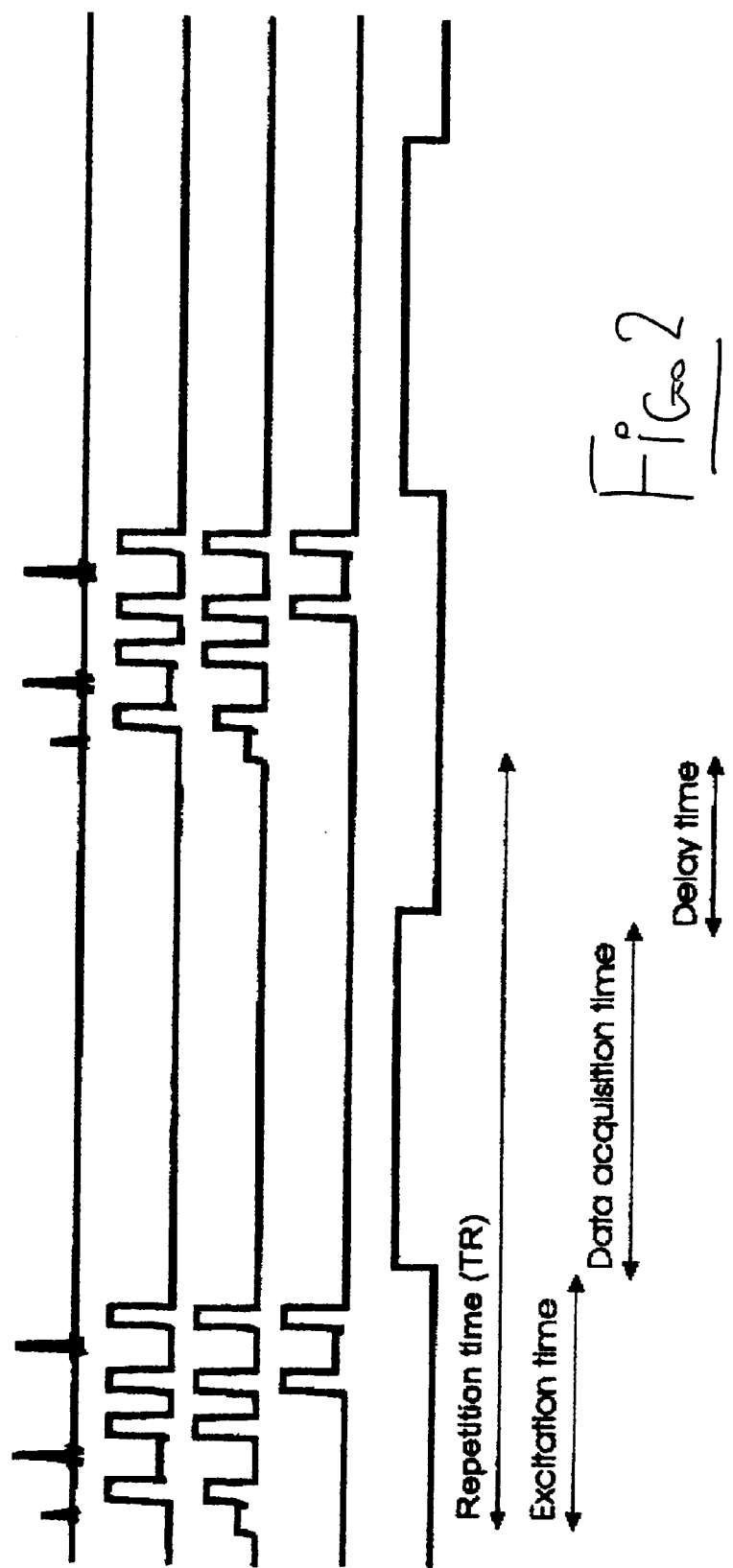
FIG. 2 is a timing diagram of the repetition time TR of one experiment in a series of experiments for generating the image including the excitation pulses conventionally used for incremented phase-encoding magnetic field gradients applied in three dimensions.

In the method described herein for obtaining spectroscopic data from voxels within the volume of interest of the sample, the sample is subjected to repeated magnetic resonance experiments with incremented phase-encoding magnetic field gradients applied. It is well known that the gradients may be applied in one, two or three dimensions for spatially encoding signal from the sample in one, two or three dimensions.

The sample is excited and phase-encoded during an excitation time (which may also included magnetization preparation such as spatial saturation and/or water suppression). The sample emits signals in response to the excitation which are detected during a data acquisition time. The sample magnetization relaxes towards equilibrium values during a subsequent delay time.

Each experiment is effected over a repetition time TR which is defined by the sum of the excitation time, the data acquisition time and any delay time prior to the next experiment.

The repetition time TR is not kept constant for all experiments required to complete the acquisition of all phase-encoded signals, but is systematically reduced as a function of experiments encoding increasing spatial frequency within the volume of interest.

The data acquisition time is reduced for experiments encoding higher spatial frequencies relative to the data acquisition time for experiments encoding lower spatial frequencies of the volume of interest, thus allowing shorter TR periods for experiments encoding higher spatial frequencies while maintaining longer TR periods with longer data acquisition times for experiments encoding lower spatial frequencies The data acquisition time for those experiments encoding low spatial frequencies is of sufficient length to obtain the desired spectral resolution, consistent with the decay of the signal due to transverse relaxation and magnetic field inhomogeneities.

The repetition time for the experiment encoding zero spatial frequency is of sufficient length to reduce effects of metabolite T1 relaxation to the desired level.

The repetition time for each MR experiment encoding increased spatial frequencies is reduced as a function of increasing spatial frequency in a defined manner which may be of Gaussian function, Hamming function, Hanning function, Fermi function, linear function, or other similar functions.

The repetition time is decreased as a function of increasing spatial frequency encoding with the following restriction: data acquisition time for those experiments encoding low spatial frequencies is maintained at the value for that experiment encoding zero spatial frequency until no further reduction in repetition time is possible by reducing the delay time, at which time further reduction in repetition time is accomplished by reducing the data acquisition time.

The repetition time can alternatively be reduced with a combination of step-wise reductions in data acquisition time and incremented reductions in delay time such that the total repetition time continues to follow a defined function.

In this alternative scheme the repetition time is reduced by stepping down the data acquisition time to a given fraction of the original value (e.g. 75%) and stepping up the delay time to obtain the desired TR, followed by gradual reduction of the delay time to zero, followed by another step down of the data acquisition time and step up of the delay time to obtain the desired TR.

The experiments are arranged such that those encoding low spatial frequencies are acquired first and those encoding higher spatial frequencies are acquired subsequently such that the repetition time is reduced gradually as a function of increasing spatial frequency.

The data acquisition time at the low spatial frequencies is selected to be of sufficient length depending upon the parameters of the experiments to provide the spectral quality required.

Figure 3:
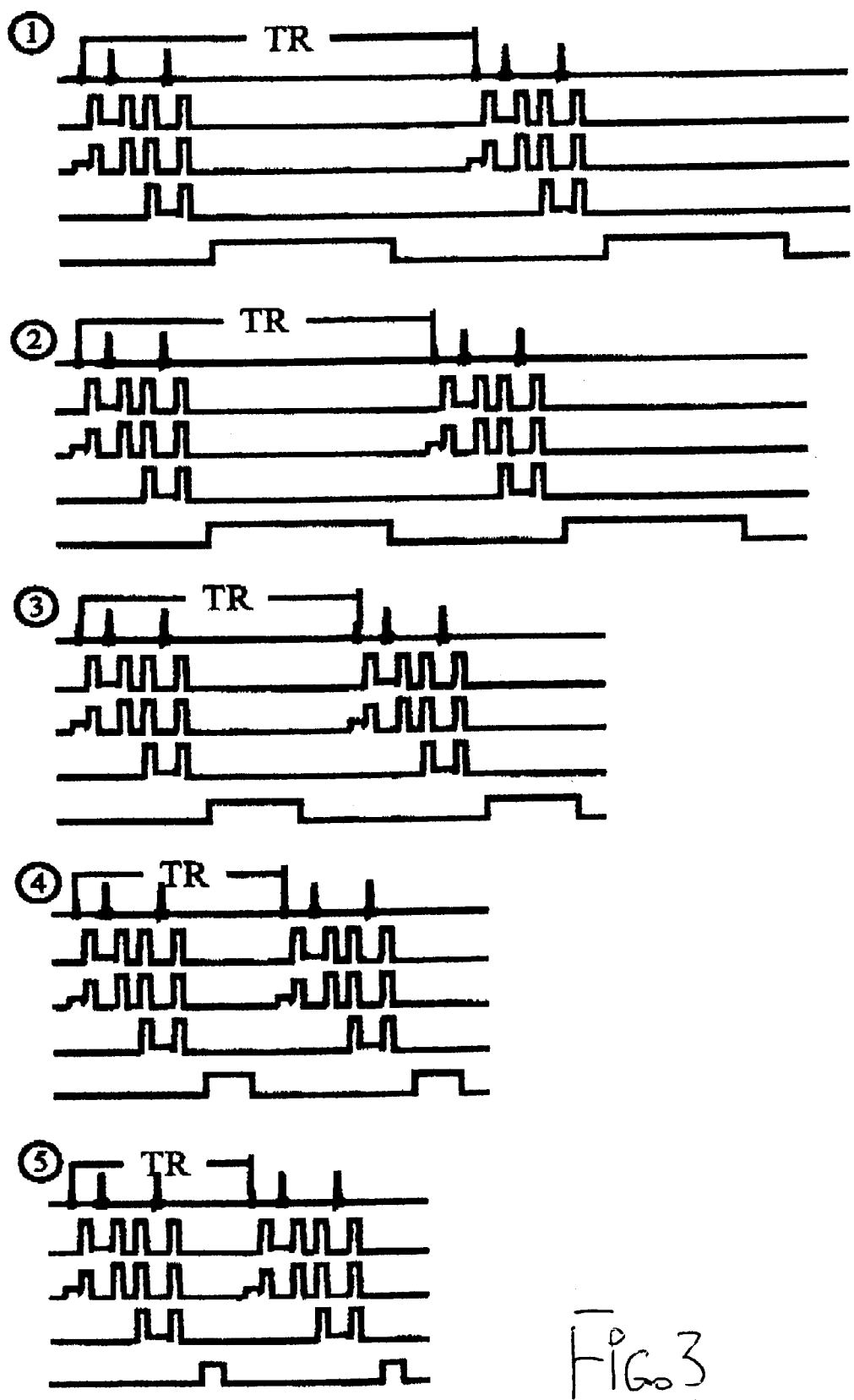
FIG. 3 is a timing diagram of a series of experiments using the excitation pulses of FIG. 2 and showing one example of the reduction in repetition time TR.

As shown in FIG. 3, as TR is reduced with increasing spatial frequency (going from timing diagram 1 to 2), in order to obtain further decreases in TR, the data acquisition time is reduced as shown from 2 to 3. Again after decrementing TR, further decreases in TR require the data acquisition time to decrease as in 3 to 4. Finally, the minimum TR is reached with a last reduction in acquisition time as in 4 to 5.

The total time for all the experiments is reduced by at least 25% and more preferably as much as 40 to 50% relative to a time for the same experiments carried out while the repetition time is kept constant.

While other equipment can be used, the experiments can be performed on a GE 1.5 T, Signa LX MR scanner equipped with Echospeed actively-shielded gradient coils using the standard bird-cage head RF coil (transmit/receive).

The standard PRESS sequence of the above equipment is modified in the present invention to incorporate a centric spiral phase-encoding scheme on the standard Cartesian grid. The repetition time TR is thus decremented as a function of spatial frequency using a Gaussian distribution.

Abrupt jumps in TR are avoided going from one value to the next by smoothly decrementing TR as the phase-encode is varied around a square spiral path. The excitation flip angle is modified with each change in TR to maintain the Ernst condition, assuming a fixed metabolite T1 of 1250 ms.

In one example, progressive reduction of the data acquisition window can be implemented as follows: the acquisition window is varied as a function of spatial frequency by utilizing the initial acquisition window of 819 ms (2500 Hz spectral width, 2048 points) until the TR is reduced to the point where reducing the acquisition window to 460 ms (2500 Hz spectral width, 1024 points) allowed further reduction in TR. This acquisition window is used until the TR is again reduced to the point where reducing the acquisition to 230 ms (512 points) allowed further reduction in TR, and finally to a 115 ms acquisition window for the highest spatial frequencies. The data was then zero-filled to 2K×24×24 for further processing.

A standard PRESS SI dataset acquired using typical parameters of TE=144 ms, TR=2000 ms, 24×24 phase encodes, total acquisition time =19 minutes is shown in FIG. 4. The corresponding FSI dataset with TE=144 ms, TR (k=0) =2000 ms, TR (k=maximum)=386 ms, total time =11 minutes, is shown in FIG. 5. A time savings of 42% over the standard SI was obtained. Representative spectra from each of the datasets are shown in FIGS. 6 and 7.

This fast spectroscopic imaging (FSI) technique provides minimal loss of spectral quality, in terms of reduced spectral resolution, by incorporating a variable acquisition window, in conjunction with a variable TR acquisition, to reduce spectroscopic imaging time by 40–50%. The variable TR SI technique by itself requires a short acquisition window, in order to gain any appreciable time-savings, and thus results in compromised spectral resolution. This is because the minimum TR time is limited by the long acquisition time typically used in spectroscopy (on the order of 0.8–1 sec for a 2500–2000 Hz spectral width and 2048 points), in addition to pulse sequence dependent parameters (CHESS water suppression scheme, spatial SAT pulses etc.). In order to maximize the time reduction in variable-TR SI, a short acquisition window is required such that the minimum TR is short and the overall scan time can be significantly reduced.

In the present technique, by utilizing a standard long acquisition window for a large fraction of the central portion of k-space, and only reducing the acquisition window for high spatial frequency acquisitions, the spectral resolution for the SI experiment can be maintained. This allows a fast spectroscopic image to be acquired in a fraction of the time of a standard SI dataset with minimal trade-off in spectral quality.

The comparable spectroscopic images using the standard and fast spectroscopic imaging techniques are shown in FIGS. 4 and 5. The distribution of NAA is similar using both techniques. Additionally, the lipid contamination in the FSI spectroscopic image is reduced as compared to the standard SI spectroscopic image. Representative spectra from each of the SI datasets, shown in FIGS. 6 and 7, show the excellent spectral quality in the FSI spectrum as compared to the standard SI spectrum.

Since various modifications can be made in this invention as herein above described, and many apparently widely different embodiments of same made within the spirit and scope of the claims without departing from such spirit and scope, it is intended that all matter contained in the accompanying specification shall be interpreted as illustrative only and not in a limiting sense.

What is claimed is:

1. A method of generating a spectroscopic image using magnetic resonance in a sample comprising:

locating a sample having a volume of interest in a magnetic field;

obtaining spectroscopic data from voxels within the volume of interest of the sample by subjecting the sample to repeated magnetic resonance experiments with incremented phase-encoding magnetic field gradients applied in one, two or three dimensions in which the sample is excited and phase-encoded during an excitation time in which the sample emits signals in response to the excitation which are detected during a data acquisition time, and in which the sample magnetization relaxes towards equilibrium values during a subsequent delay time;

wherein each experiment is effected over a repetition time TR which is defined by the sum of the excitation time, the data acquisition time and any delay time prior to the next experiment;

wherein the TR is not kept constant for all experiments required to complete the acquisition of all phase-encoded signals, but is systematically reduced as a function of experiments encoding increasing spatial frequency within the volume of interest;

and wherein the data acquisition time is reduced for experiments encoding higher spatial frequencies relative to the data acquisition time for experiments encoding lower spatial frequencies of the volume of interest, thus allowing shorter TR periods for experiments encoding higher spatial frequencies while maintaining longer TR periods with longer data acquisition times for experiments encoding lower spatial frequencies.

2. The method according to claim 1 wherein the data acquisition time for those experiments encoding low spatial frequencies is of sufficient length to obtain the desired spectral resolution, consistent with the decay of the signal due to transverse relaxation and magnetic field inhomogeneities.

3. The method according to claim 1 wherein the repetition time for that experiment encoding zero spatial frequency is of sufficient length to reduce effects of metabolite T1 relaxation to the desired level.

4. The method according to claim 1 wherein the repetition time for each MR experiment encoding increased spatial frequencies is reduced as a function of increasing spatial frequency in a defined manner.

5. The method according to claim 3 wherein the defined manner is selected from the group consisting of Gaussian function, Hamming function, Hanning function, Fermi function, linear function, or other similar functions.

6. The method according to claim 1 wherein the repetition time is decreased as a function of increasing spatial frequency encoding with the following restriction: data acquisition time for those experiments encoding low spatial frequencies is maintained at the value for that experiment encoding zero spatial frequency until no further reduction in repetition time is possible by reducing the delay time, at which time further reduction in repetition time is accomplished by reducing the data acquisition time.

7. The method according to claim 1 wherein the repetition time is reduced with a gradual reduction in data acquisition time.

8. The method according to claim 1 wherein the repetition time is reduced with a combination of step-wise reductions in data acquisition time and incremented reductions in delay time such that the total repetition time continues to follow a defined function.

9. The method according to claim 8 wherein the repetition time is reduced by stepping down the data acquisition time to a fraction of the original value (e.g. to 75% of the original value) and stepping up the delay time to obtain the desired TR, followed by gradual reduction of the delay time to zero, followed by another step down of the data acquisition time and step up of the delay time to obtain the desired TR.

10. The method according to claim 1 wherein the experiments are arranged such that those encoding low spatial frequencies are acquired first and those encoding higher spatial frequencies are acquired subsequently such that the repetition time is reduced gradually as a function of increasing spatial frequency.

11. The method according to claim 1 the total time for all the experiments is reduced by at least 25% and more preferably 40 to 50% relative to a time for the same experiments carried out while the repetition time is kept constant.

* * * * *